(12) United States Patent
Oikubo et al.

(10) Patent No.: US 10,120,492 B2
(45) Date of Patent: Nov. 6, 2018

(54) TOUCH SENSOR AND INFORMATION PROCESSING SYSTEM

(71) Applicant: ALPINE ELECTRONICS, INC., Shinagawa-ku, Tokyo (JP)

(72) Inventors: Wataru Oikubo, Tokyo (JP); Yusuke Yoshida, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 3 days.

(21) Appl. No.: 15/244,700

(22) Filed: Aug. 23, 2016

(65) Prior Publication Data
US 2017/0115804 A1 Apr. 27, 2017

(30) Foreign Application Priority Data

Oct. 23, 2015 (JP) ................................. 2015-208624

(51) Int. Cl.
| | |
|---|---|
| *G06F 3/045* | (2006.01) |
| *G06F 3/041* | (2006.01) |
| *G06F 3/044* | (2006.01) |
| *H01L 27/32* | (2006.01) |
| *H03K 17/96* | (2006.01) |

(52) U.S. Cl.
CPC ............ *G06F 3/0416* (2013.01); *G06F 3/044* (2013.01); *H01L 27/323* (2013.01); *H03K 17/9622* (2013.01); *G06F 2203/04111* (2013.01); *H03K 2217/960795* (2013.01)

(58) Field of Classification Search
CPC ...................... G06F 3/045; G06F 3/047; G06F 2203/04111; G06F 3/0416; G06F 3/044; H01L 27/323

USPC .................................................. 345/173, 174
See application file for complete search history.

(56) References Cited

U.S. PATENT DOCUMENTS

| | | | |
|---|---|---|---|
| 2009/0085890 A1* | 4/2009 | Saito ....................... | G06F 3/045 345/174 |
| 2012/0062472 A1* | 3/2012 | Yilmaz ................... | G06F 3/041 345/173 |
| 2015/0091855 A1* | 4/2015 | Chen ...................... | G06F 3/0412 345/174 |

FOREIGN PATENT DOCUMENTS

| | | |
|---|---|---|
| JP | 2003-272834 | 9/2003 |
| JP | 2009-026630 | 2/2009 |
| JP | 2011-150502 | 8/2011 |

* cited by examiner

*Primary Examiner* — Insa Sadio
(74) *Attorney, Agent, or Firm* — Brinks Gilson & Lione

(57) ABSTRACT

A touch sensor module is structured by laminating an organic EL layer and a smoked glass layer on a substrate, which has a positive electrode pattern and a negative electrode pattern on the upper surface. When a driving voltage is applied to the positive electrode pattern, a current flows in a segment between the positive electrode pattern and the negative electrode pattern in the organic EL layer and the segment emits light. The emitted light causes a figure that represents a key to appear on the display surface of the touch sensor module. When the user touches a portion in which the figure representing a key is displayed on the display surface of the touch sensor module, a capacitance between the positive electrode pattern and the negative electrode pattern changes. Accordingly, the user's touch to the figure representing a key is detected.

12 Claims, 7 Drawing Sheets

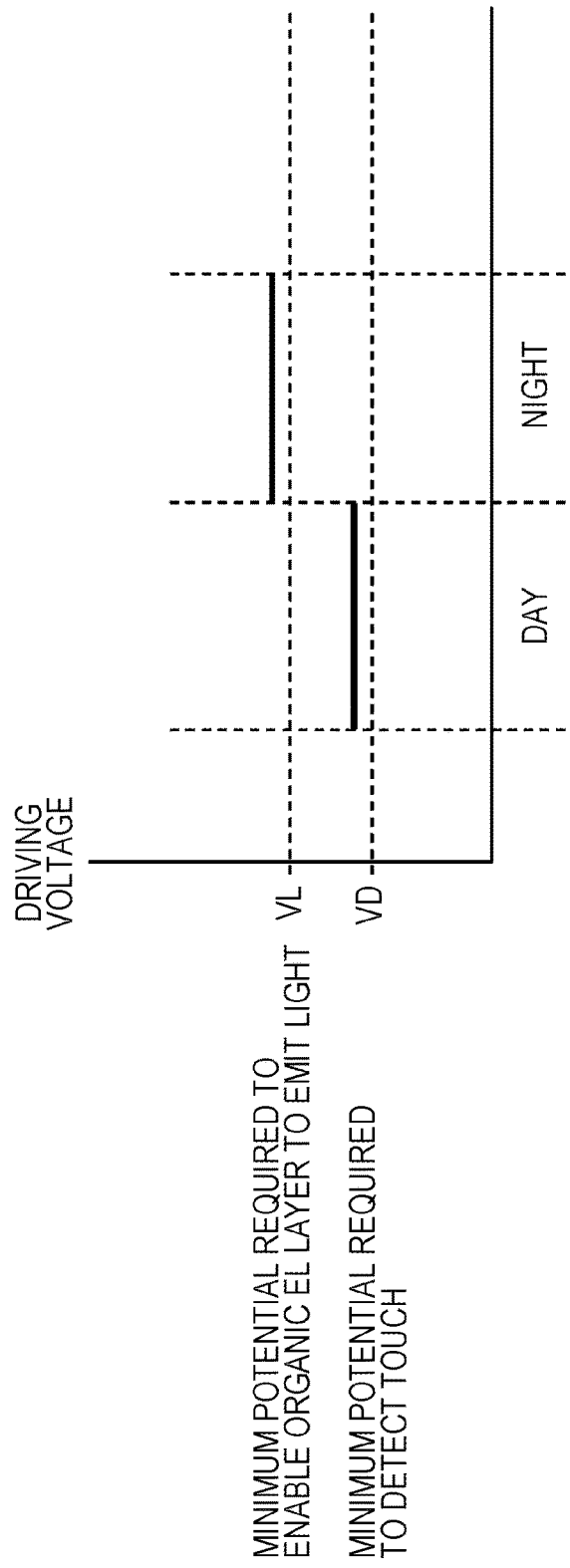

TOUCH SENSOR AND INFORMATION PROCESSING SYSTEM

RELATED APPLICATION

The present application claims priority to Japanese Patent Application Number 2015-208624, filed Oct. 23, 2015, the entirety of which is hereby incorporated by reference.

BACKGROUND

1. Field of the Invention

The present invention relates to a touch sensor that has a display function based on emitted light.

2. Description of the Related Art

A known touch sensor having a display function based on emitted light includes a transparent plate, a decorative layer that represents keys, a substantially transparent touch sensor layer constituting a capacitive touch sensor, and an illumination layer, which functions as an inorganic electro-luminescence (EL) element; these elements are laminated in that order from the front of the touch sensor (see Japanese Unexamined Patent Application Publication No. 2011-150502, for example). In this touch sensor, the decorative layer is illuminated by the illumination layer from the back of the decorative layer so that keys are displayed to the user by transmitted light in the decorative layer. The illumination layer in this touch sensor is comprised of an insulating layer, a transparent electrode layer, a light-emitting body layer, which is an inorganic EL layer, a dielectric layer, a rear electrode layer, and a protecting layer.

An EL element structured so that an organic EL layer is sandwiched between a pair of electrodes is also known (see Japanese Unexamined Patent Application Publication No. 2003-272834, for example). A technology is also known by which this type of organic EL layer is formed by applying a coating made of an organic EL material (see Japanese Unexamined Patent Application Publication No. 2009-26630, for example).

SUMMARY

With the technology by which the above transparent plate, decorative layer, touch sensor layer, and illumination layer constitute a touch sensor having a display function based on emitted light, it is necessary to provide the decorative layer used to display keys and the illumination layer, which is comprised of a large number of layers as described above, separately from the touch sensor layer, so an increased number of layers makes the structure complex. This has been an obstacle to reducing the thickness of a touch sensor having a display function based on emitted light and lowering the cost of the touch sensor.

In view of this situation, an object of embodiments of the present invention is to achieve a touch sensor having a display function based on emitted light with a simpler structure.

In the present disclosure, to achieve the above object, a touch sensor module used in a touch sensor device that has a display function based on emitted light and a touch detection function has a substrate, a positive electrode pattern and a negative electrode pattern disposed on the upper surface of the substrate, an electro-luminescence (EL) layer laminated on the substrate on which the positive electrode pattern and negative electrode pattern are disposed, and a protective layer laminated on the EL layer, the protective layer transmitting at least part of the light emitted from the EL layer.

This type of touch sensor module is specifically formed so that the positive electrode pattern and negative electrode pattern are shaped and disposed so as to match a shape in which a portion of the organic EL layer forms a character, a symbol, or a figure, the portion emitting light when a driving voltage is applied across the positive electrode pattern and the negative electrode pattern, and to match the position of the shape.

Alternatively, this type of touch sensor module is specifically formed so that the EL is shaped and disposed so as to form a character, symbol, or figure and that the positive electrode pattern and negative electrode pattern are shaped and disposed so as to match a shape in which the organic EL layer emits light when a driving voltage is applied across the positive electrode pattern and the negative electrode pattern and to match the position of the shape.

In the touch sensor module described above, the protective layer may be a transparent glass or transparent sheet or may be a smoked glass or smoked sheet.

To achieve the object described above, the present disclosure provides a touch sensor device that has the touch sensor module described above and a controller. The controller applies a driving voltage across the positive electrode pattern and the negative electrode pattern to cause the EL layer or part of it to emit light and also detects a touch by the user according to a change in capacitance between the positive electrode pattern and the negative electrode pattern.

According to the touch sensor module described above, the electrode patterns formed on the substrate can fulfill the roles of both electrode patterns used to drive the EL layer and electrode patterns used to detect a touch. Therefore, it is possible to achieve a touch sensor module having a display function based on emitted light and a touch detection function with a simple structure having a small number of layers.

Furthermore, in the present disclosure, to achieve the above object, a touch sensor module used in a touch sensor device that has a display function based on emitted light and a touch detection function has a substrate with a positive electrode pattern for display use, a negative electrode pattern for display use, a positive electrode pattern for detection use, and a negative electrode pattern for detection use that are disposed on the upper surface of the substrate, an EL layer laminated on the substrate on which the positive electrode pattern for display use, the negative electrode pattern for display use, the positive electrode pattern for detection use, and the negative electrode pattern for detection use are disposed, and a protective layer laminated on the EL layer, the protective layer transmitting at least part of the light emitted from the EL layer.

This type of touch sensor module is specifically formed so that the EL is shaped and disposed so as to form a character, symbol, or figure and that the positive electrode pattern for display use and the negative electrode pattern for display use are shaped and disposed so as to match a shape in which the organic EL layer emits light when a driving voltage is applied across the positive electrode pattern for display use and the negative electrode pattern for display use and to match the position of the shape. The positive electrode pattern for detection use and the negative electrode pattern for detection use are disposed around a portion of the EL layer, the portion emitting light, when viewed from a direction orthogonal to the EL layer.

In this type of touch sensor module, the protective layer may be a transparent glass or transparent sheet or may be a smoked glass or smoked sheet.

According to the touch sensor module and touch sensor device described above, both electrode patterns used to drive the EL pattern and electrode patterns used to detect a touch are formed as electrode patterns disposed on the same substrate. Therefore, it is possible to achieve a touch sensor module having a display function based on emitted light and a touch detection function with a simple structure having a small number of layers.

Furthermore, to achieve the above object, the present disclosure also provides a touch sensor device that has the touch sensor module described above and a controller. The controller applies a driving voltage across the positive electrode pattern for display use and the negative electrode pattern for display use to cause the EL layer or part of it to emit light and also detects a touch by the user according to a change in capacitance between the positive electrode pattern for detection use and the negative electrode pattern for detection use.

The present disclosure also provides an information processing system that includes one of the touch sensor devices described above and a processing unit that performs data processing by using the touch sensor device as an input device that accepts manipulations performed by the user.

As described above, a touch sensor having a display function based on emitted light can be achieved with a simpler structure.

BRIEF DESCRIPTION OF THE DRAWINGS

FIG. 5 illustrates the driving voltage of the touch sensor module in a third embodiment of the present invention;

DESCRIPTION OF THE PREFERRED EMBODIMENTS

Embodiments of the present invention will be described by taking an example in which the embodiments are applied to an audio video (AV) system mounted in a vehicle. First, a first embodiment will be described.

Figure 1A:
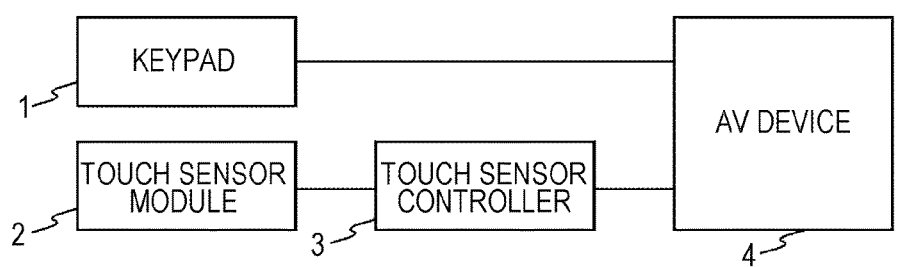
FIG. 1A is a block diagram illustrating a structure of an AV system in a first embodiment of the present invention.

FIG. 1A illustrates a structure of an AV system in the first embodiment. As illustrated in the drawing, the AV system has a keypad 1, a touch sensor module 2, a touch sensor controller 3, and an AV device 4.

Figure 1B:
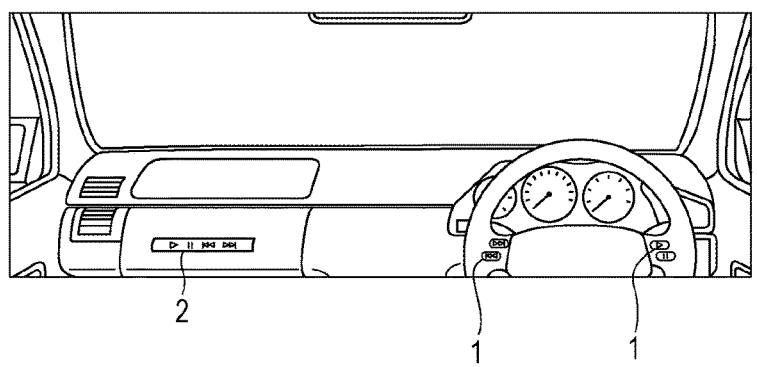
FIG. 1B illustrates the layout of the AV system.

The keypad 1 is a manipulation input device for the driver. Keypads 1 are disposed, for example, on the steering wheel as illustrated in FIG. 1B. The touch sensor module 2 is a manipulation input device for, for example, the passenger in the passenger seat. In this case, the touch sensor module 2 is disposed at a position on the dashboard, the position being in front of the passenger seat, as illustrated in FIG. 1B.

The AV device 4 is a device that reproduces audio contents and video contents, outputs them, and performs other processing; the AV device 4 uses the keypad 1 or touch sensor module 2 to accept a manipulation by the user and controls a reproduction operation for contents in response to the accepted manipulation.

The touch sensor module 2 will be described below in detail.

Figure 2A:
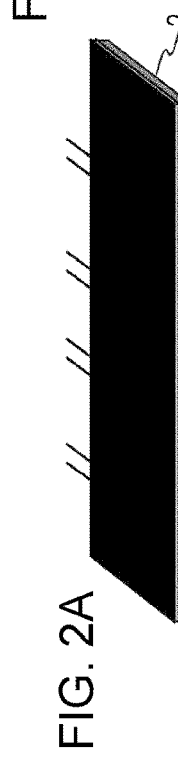
FIGS. 2A to 2D illustrate a structure of a touch sensor module in the first embodiment of the present invention.
Figure 2B:
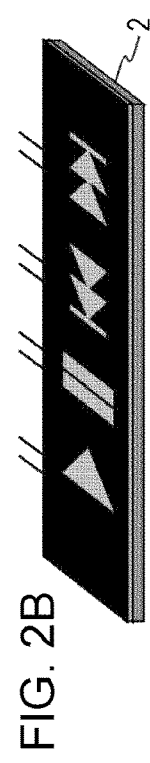

FIGS. 2A and 2B illustrate the outside shape of the touch sensor module 2.

As illustrated in these drawings, the touch sensor module 2 has a sheet-like (thin-plate-like) outside shape. The touch sensor module 2 has a black-out display function by which, when the touch sensor module 2 is not in operation, a display surface appears in black as illustrated in FIG. 2A, and by which, when the touch sensor module 2 in operation, figures appear on a black background on the display screen due to emitted light as illustrated in FIG. 2B, the figures representing keys that accept manipulations for the AV device 4. The touch sensor module 2 also has a touch sensor function that detects a touch of a figure by the user during an operation.

Next, the layer structure of the touch sensor module 2 will be described below with reference to FIG. 2C. In the description below, a direction parallel to the display surface of the touch sensor module 2 will be referred to a horizontal direction and a direction perpendicular to the display surface will be referred to as the vertical direction.

As illustrated in the drawing, the layer structure of the touch sensor module 2 is such that an organic EL layer 22 and a smoked glass layer 23 are laminated on a substrate 21, which has positive electrode patterns and negative electrode patterns on the upper surface. The upper surface of the smoked glass layer 23 is the display surface of the touch sensor module 2 described above. The organic EL layer 22 can be formed by, for example, applying a coating made of an organic EL material to the substrate 21 on which positive electrode patterns and negative electrode patterns are formed.

Figure 2C:
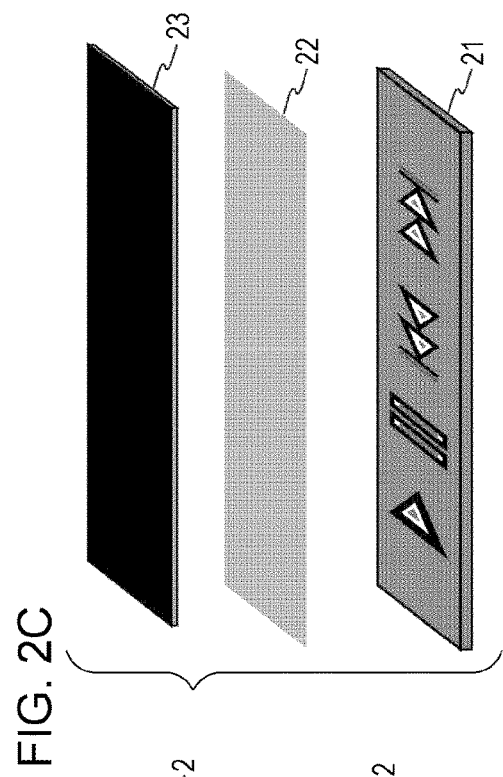
Figure 2D:
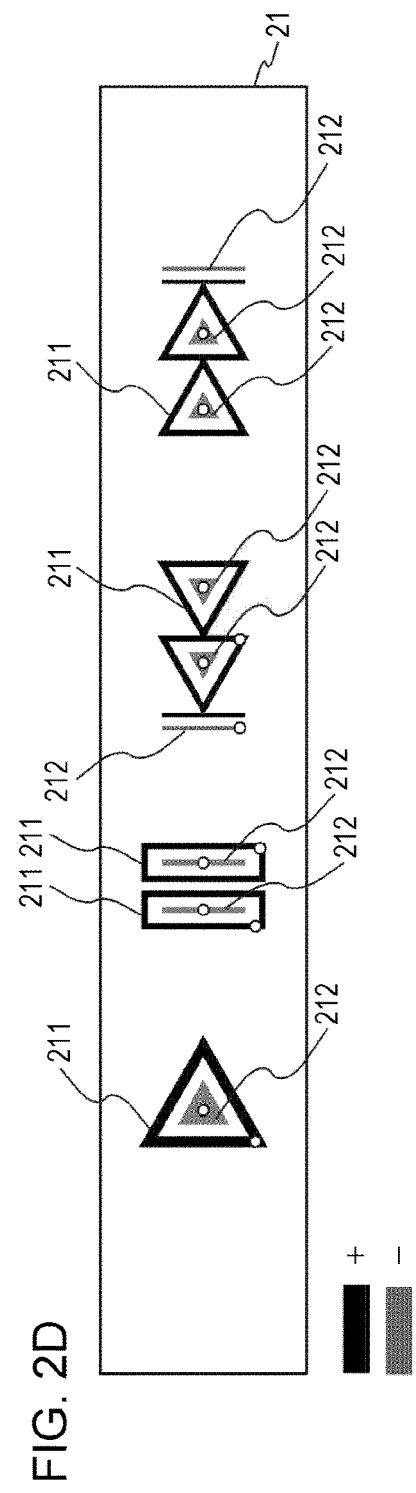

As in an example illustrated in FIG. 2D, a positive electrode pattern 211 and a negative electrode pattern 212 are separated from each'other. A shape is formed by combining the positive electrode pattern 211, the negative electrode pattern 212, and a portion between the positive electrode pattern 211 and negative electrode pattern 212 disposed close to each other so that the shape matches the shape of a figure displayed on the display surface.

The positive electrode pattern 211 is connected to a positive output of the touch sensor controller 3, and the negative electrode pattern 212 is connected to a negative output of the touch sensor controller 3. In the example in FIG. 2D, the positive electrode pattern 211 and the negative electrode pattern 212 are electrically connected to the bottom surface of the substrate 21 through via holes and are connected to the touch sensor controller 3 through wiring patterns provided on the bottom surface.

Figure 3A:
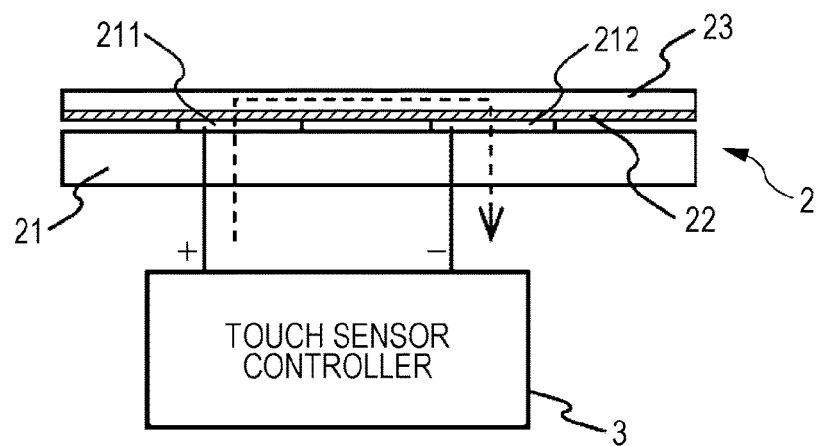
FIGS. 3A and 3B illustrate the effect of a touch sensor module in the first embodiment of the present invention.

In this touch sensor module 2, when the touch sensor controller 3 connects the negative electrode pattern 212 to ground and applies a driving voltage to the positive electrode pattern 211 as illustrated in FIG. 3A, a current flows in a segment between the positive electrode pattern 211 and negative electrode pattern 212 in the organic EL layer 22 and the segment emits light. The emitted light causes a figure that represents a key to appear on the display surface of the touch sensor module 2.

Figure 3B:
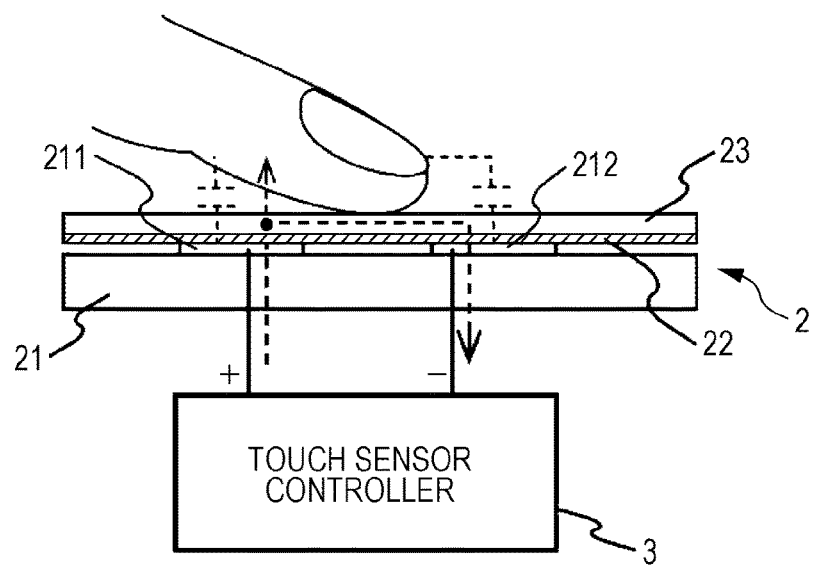

When the user touches a portion, on the display surface of the touch sensor module 2, in which the figure representing a key is displayed, as illustrated in FIG. 3B, a capacitance between the positive electrode pattern 211 and the negative electrode pattern 212 changes due to capacitive coupling between the user and the portion, so the current flowing from the positive electrode pattern 211 to the negative electrode pattern 212 changes. According to this change, the touch sensor controller 3 detects the user's touch to the portion, on the display surface of the touch sensor module 2, in which the figure representing a key is displayed. The AV device 4 is notified of the occurrence of the touch together with the coordinates at which the touch has occurred. The AV device 4 then accepts the user's manipulation for the key represented by the figure displayed on the position corresponding to the coordinates at which the touch has occurred, the coordinates having been output from the touch sensor controller 3. So far, the first embodiment of the present invention has been described. In the first embodiment, however, the smoked glass layer 23 described above may be replaced with a smoked sheet. Alternatively, in the first embodiment, the smoked glass layer 23 may be replaced with a transparent glass layer or a transparent sheet. If the smoked glass 23 is replaced in this way, when the touch sensor module 2 is not in operation, its display surface appears in a color that the organic EL layer 22 has when it does not emit light. Therefore, the organic EL layer 22 is formed by applying a coating made of an organic EL material and a coloring agent in an appropriate color.

A second embodiment of the present invention will be described below. The second embodiment differs from the first embodiment described above only in the structure of the touch sensor module 2.

Figure 4A:
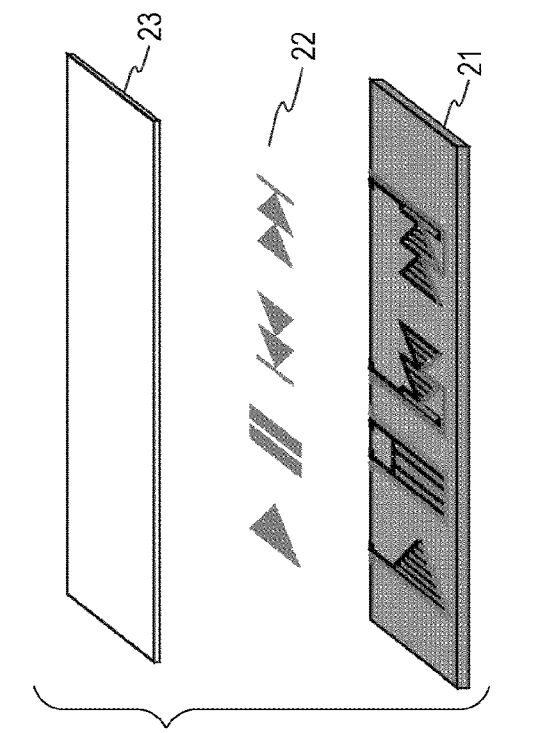
FIGS. 4A to 4D illustrate another structure of the touch sensor module in a second embodiment of the present invention.
Figure 4B:
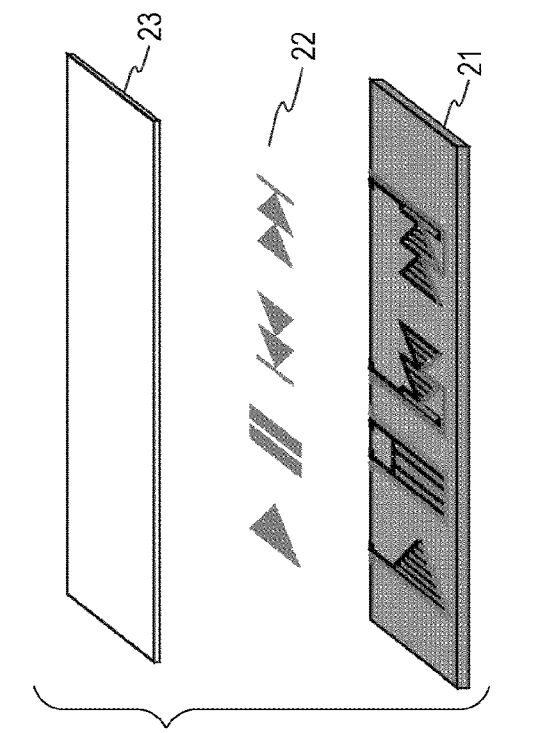

FIGS. 4A and 4B illustrate the outside shape of the touch sensor module 2 in the second embodiment.

As illustrated in these drawings, the touch sensor module 2 has a sheet-like (thin-plate-like) outside shape. When the touch sensor module 2 is not in operation, reflected light due to external light causes figures representing keys that accept manipulation for the AV device 4 to appear on the display surface, as illustrated in FIG. 4A. When the touch sensor module 2 is in operation, it is possible not only to use reflected light to cause the figures representing keys to appear as illustrated in FIG. 4A but also to emit light to cause the figures to appear as illustrated in FIG. 4B.

The touch sensor module 2 also has a touch sensor function that detects a touch of a figure by the user while the touch sensor module 2 is in operation.

Figure 4C:
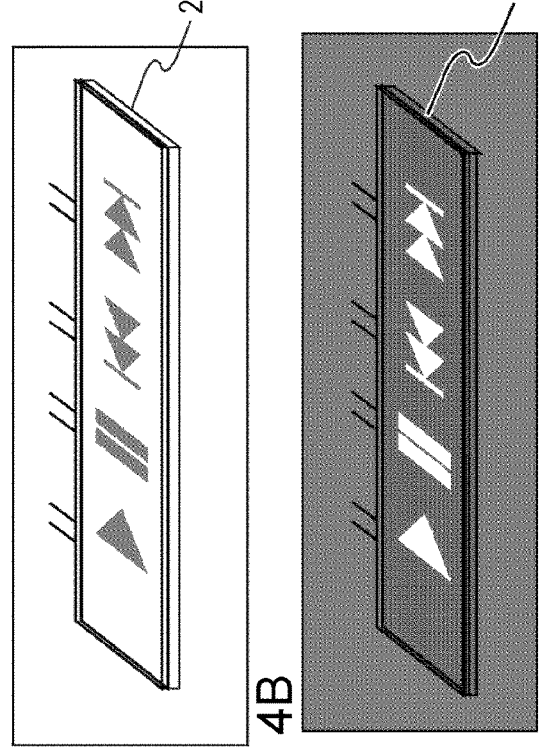

Next, the layer structure of the touch sensor module 2 in the second embodiment will be described below with reference to FIG. 4C.

As illustrated in the drawing, the touch sensor module 2 in the second embodiment differs from the touch sensor module 2 in the first embodiment illustrated in FIG. 2C only in the organic EL layer 22. Specifically, although, in the first embodiment, the organic EL layer 22 has been disposed on the entire surface of the substrate 21, the organic EL layer 22 in the second embodiment is laminated on the substrate 21 so that the organic EL layer 22 is present only in portions in which figures represent keys on the display surface. That is, the shape of the organic EL layer 22 in the horizontal direction is made to match the shape of the figures that represent keys on the display surface, and the size and position of the organic EL layer 22 are also made to match the size and position of the figures. The organic EL layer 22 has a different color than the substrate 21. That is, the organic EL layer 22 is formed by, for example, applying a coating made of an organic EL material and a coloring agent in a color different than the color of the substrate 21.

Figure 4D:
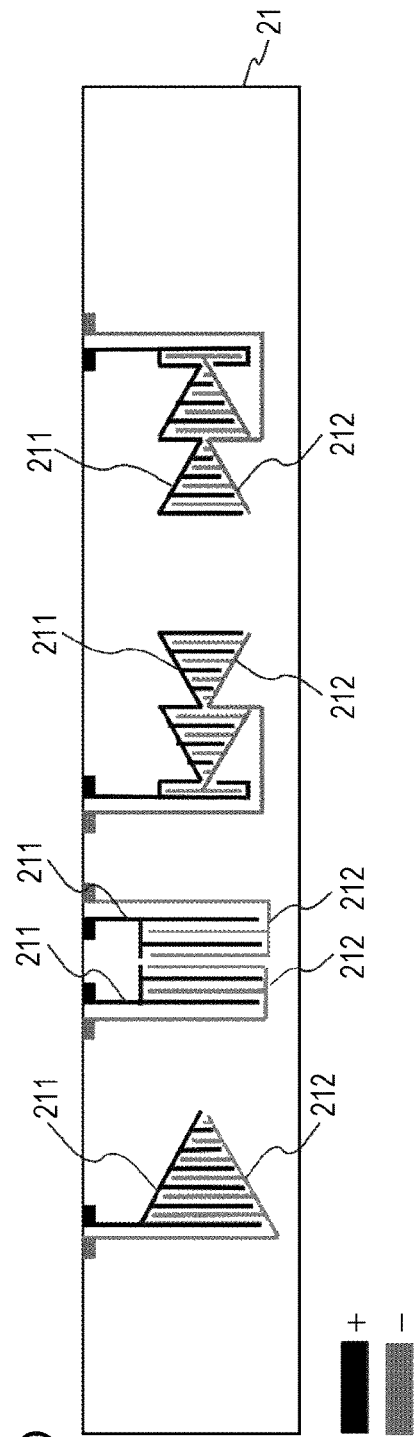

Next, examples of the positive electrode pattern 211 and the negative electrode pattern 212 formed on the substrate 21 will be described with reference to FIG. 4D. The examples of the positive electrode pattern 211 and negative electrode pattern 212 in FIG. 4D differ from the patterns illustrated in FIG. 2D. In these examples, the positive electrode pattern 211 and negative electrode pattern 212 are connected to the touch sensor controller 3 through wiring patterns formed on the upper surface of the substrate 21.

So far, the second embodiment of the present invention has been described.

A third embodiment of the present invention will be described below. The third embodiment differs from the second embodiment only in the method by which the touch sensor controller 3 drives the touch sensor module 2. Specifically, in the third embodiment, a spacing between the positive electrode pattern 211 and the negative electrode pattern 212 of the touch sensor module 2, the resistivity of the organic EL layer 22, and the like are set so that the minimum potential VD that the touch sensor controller 3 must output to detect a touch by the user is lower than the minimum potential VL that the touch sensor controller 3 must output to enable the organic EL layer 22 to emit light as illustrated in FIG. 5.

During the day, the touch sensor controller 3 applies a driving voltage equal to or higher than VD but lower than VL to the positive electrode pattern 211; during the night, the touch sensor controller 3 applies a driving voltage equal to or higher than VL to the positive electrode pattern 211.

To make a discrimination between the day and the night, whether the headlights of a vehicle are turned on is detected. If the headlights of a vehicle are turned off, the time is discriminated as the day; if the headlights are turned on, the time is discriminated as the night. Alternatively, an illumination sensor that detects an illumination intensity inside or outside the vehicle may be attached to make a discrimination between the day and the night according to the illumination intensity detected by the illumination sensor.

Since the touch sensor controller 3 drives the touch sensor module 2 as described above, during the day, reflected light can be used to cause the figures representing keys that accept manipulations for the AV device 4 to appear on the display surface of the touch sensor module 2 as illustrated in FIG. 4A and, during the night, the figures representing keys can be made to appear by emitting light as illustrated in FIG. 4B.

The driving voltage during the night is higher than during the day, and the sensitivity of the touch sensor module 2 to a touch by the user during the night is thereby higher than during the day. In the detection of a touch by the user, therefore, the touch sensor controller 3 compensates an amount by which the sensitivity is raised.

So far, the third embodiment of the present invention has been described.

Figure 6A:
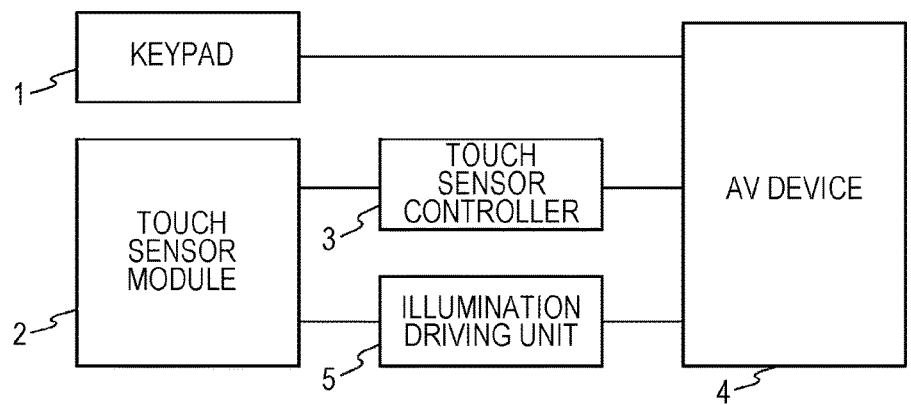
FIGS. 6A and 6B illustrate another structure of the AV system in a fourth embodiment of the present invention.

A fourth embodiment of the present invention will be described below. FIG. 6A illustrates the structure of an AV system in a fourth embodiment. As illustrated in the drawing, the AV system in the fourth embodiment has a structure in which an illumination driving unit 5 is added to the AV system in the first embodiment illustrated in FIGS. 1A and 1B.

Figure 6B:
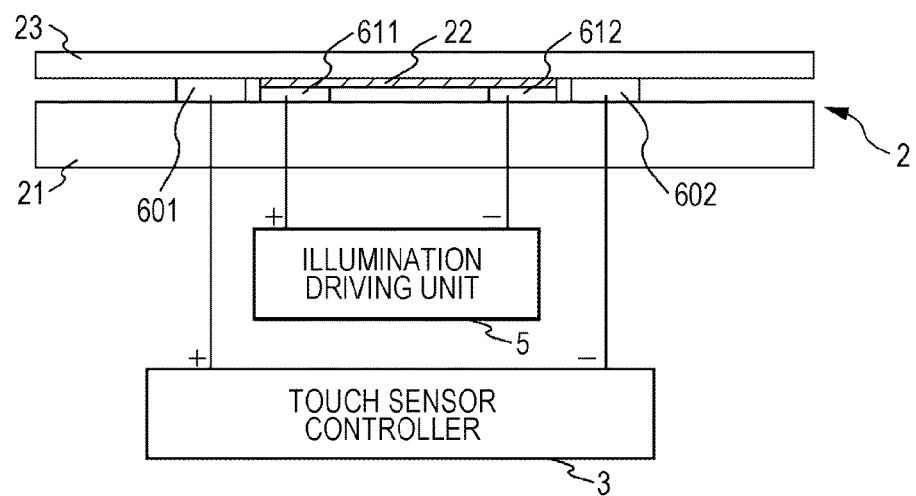

In the fourth embodiment, a positive electrode pattern 601 and a negative electrode pattern 602 for a touch sensor and a positive electrode pattern 611 and a negative electrode pattern 612 used to drive the organic EL layer 22 are also provided on the substrate 21 of the touch sensor module 2, as illustrated in FIG. 6B.

The organic EL layer 22 and the positive electrode pattern 611 and the negative electrode pattern 612 used to drive the organic EL layer 22 are laminated on the substrate 21 as with the touch sensor module 2 in the second embodiment. However, the positive electrode pattern 601 and negative electrode pattern 602 for a touch sensor are disposed in the vicinity of the figures represented by the organic EL layer 22 in the horizontal direction at positions at which the positive electrode pattern 601 and negative electrode pattern 602 do not overlap the organic EL layer 22 when viewed in the vertical direction so that, on the display surface, touches to portions by the user at which the figures appear can be detected.

In the fourth embodiment, the illumination driving unit 5 drives the positive electrode pattern 611 and the negative electrode pattern 612 used to drive the organic EL layer 22 to enable the organic EL layer 22 to emit light, and the touch sensor controller 3 drives the positive electrode pattern 601 and the negative electrode pattern 602 for a touch sensor to detect a touch by the user.

So far, embodiments of the present invention have been described.

Figure 7:
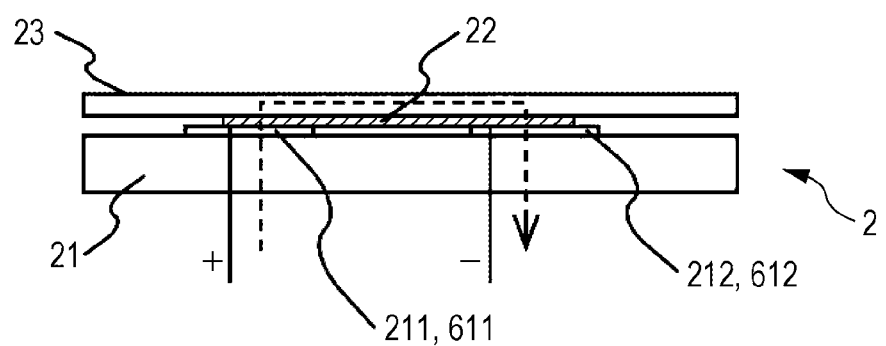
FIG. 7 illustrates another structure of the touch sensor module in the second embodiment of the present invention.

The positive electrode pattern 211 and the negative electrode pattern 212 in the second and third embodiments and the positive electrode pattern 611 and the negative electrode pattern 612 used to drive the organic EL layer 22 in the fourth embodiment may be disposed so as to protrude to a certain extent from the edge of the organic EL layer 22 that represent figures as illustrated in FIG. 7 to prevent emitted light from falling short at a position at the edge of the organic EL layer 22.

Although examples in which the touch sensor module 2 displays a figure that represents a key have been described, the touch sensor module 2 may be structured so as to display a character, a symbol, or the like. In this case, it suffices to form and dispose the positive electrode pattern 211 and the negative electrode pattern 212 or the positive electrode pattern 611 and the negative electrode pattern 612 used to drive the organic EL layer 22 so as to match a shape in which a portion of the organic EL layer 22 that emits light when a driving voltage is applied forms a character, a symbol, or the like and to match the position of the shape.

Although the embodiments of the present invention have been described by taking an example in which the embodiments are applied to the AV system mounted in a vehicle, the touch sensor module 2 described in the embodiments can be applied to any system that uses a touch sensor to accept an input.

As described above, in the embodiments, both of the electrodes used to drive the organic EL layer 22 and the electrodes for a touch sensor are formed as patterns disposed on a single substrate 21. Therefore, the touch sensor module 2 having a display function based on emitted light and a touch detection function can be achieved with a simple structure having a small number of layers. In addition, in the first to third embodiments in which the same electrodes are shared as the electrodes used to drive the organic EL layer 22 and the electrodes for a touch sensor, the structure of the touch sensor module 2 can be further simplified.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. A touch sensor used in a touch sensor device that has a display function based on emitted light and a touch detection function, the touch sensor comprising:
    a substrate;
    a positive electrode pattern and a negative electrode pattern disposed on an upper surface of the substrate;
    an electro-luminescence (EL) layer laminated on the substrate on which the positive electrode pattern and the negative electrode pattern are disposed; and
    a protective layer laminated on the EL layer, the protective layer transmitting at least part of light emitted from the EL layer;
    wherein the positive electrode pattern and the negative electrode pattern are configured to cause at least part of the EL layer to emit light and also to detect a touch by a user on the touch sensor; and
    wherein the positive electrode pattern and the negative electrode pattern are separated from each other and are shaped and disposed so as to match a shape in which a portion of the EL layer forms a character, a symbol, or a figure, the portion emitting light when a driving voltage is applied across the positive electrode pattern and the negative electrode pattern, and to match a position of the shape, where the shape is formed by combining the positive electrode pattern, the negative electrode pattern, and a portion between the positive electrode pattern and the negative electrode pattern.

2. The touch sensor according to claim 1, wherein the protective layer is a transparent glass layer or a transparent sheet.

3. The touch sensor according to claim 1, wherein the protective layer is a smoked glass layer or a smoked sheet.

4. A touch sensor device comprising:
    the touch senor according to the claim 1; and
    a controller; wherein
    the controller applies the driving voltage across the positive electrode pattern and the negative electrode pattern and also detects a touch by a user according to a change in capacitance between the positive electrode pattern and the negative electrode pattern.

5. The touch sensor according to claim 1, wherein:
    the EL is shaped and disposed so as to form a character, a symbol, or a figure; and
    the positive electrode pattern and the negative electrode pattern are shaped and disposed so as to match a shape in which the EL layer emits light when a driving voltage is applied across the positive electrode pattern and the negative electrode pattern and to match a position of the shape.

6. An information processing system comprising;
    the touch sensor device according to claim 5; and
    a processing unit that performs data processing by using the touch sensor device as an input device that accepts a manipulation performed by a user.

7. A touch sensor device comprising:
    the touch sensor according to claim 1; and
    a controller; wherein
    the controller applies a driving voltage across the positive electrode pattern and the negative electrode pattern to cause at least part of the EL layer to emit light and also detects a touch by a user according to a change in capacitance between the positive electrode pattern use and the negative electrode pattern.

8. A touch sensor used in a touch sensor device that has a display function based on emitted light and a touch detection function, the touch sensor comprising:
a substrate;
a positive electrode pattern for display use, a negative electrode pattern for display use, a positive electrode pattern for detection use, and a negative electrode pattern for detection use that are disposed on an upper surface of the substrate;
an EL layer laminated on the substrate on which the positive electrode pattern for display use, the negative electrode pattern for display use, the positive electrode pattern for detection use, and the negative electrode pattern for detection use are disposed; and
a protective layer laminated on the EL layer, the protective layer transmitting at least part of light emitted from the EL layer;
wherein the EL layer is shaped and disposed so as to form a character, a symbol, or a figure; the positive electrode pattern for display use and the negative electrode pattern for display use are separated from each other and are shaped and disposed so as to match a shape in which the EL layer emits light when a driving voltage is applied across the positive electrode pattern for display use and the negative electrode pattern for display use and to match a position of the shape where the shape is formed by combining the positive electrode pattern for display use, the negative electrode pattern for display use, and a portion between the positive electrode pattern for display use and the negative electrode pattern for display use; and the positive electrode pattern for detection use and the negative electrode pattern for detection use are disposed around a portion of the EL layer, the portion emitting light, when viewed from a direction orthogonal to the EL layer.

9. The touch sensor according to claim 8, wherein the protective layer is a transparent glass layer or a transparent sheet.

10. The touch sensor according to claim 8, wherein the protective layer is a smoked glass layer or a smoked sheet.

11. A touch sensor device comprising:
the touch sensor according to claim 8; and
a controller; wherein
the controller applies a driving voltage across the positive electrode pattern for display use and the negative electrode pattern for display use and also detects a touch by a user according to a change in capacitance between the positive electrode pattern for detection use and the negative electrode pattern for detection use.

12. A touch sensor device comprising:
the touch sensor according to claim 8; and
a controller; wherein
the controller applies a driving voltage across the positive electrode pattern for display use and the negative electrode pattern for display use to cause at least part of the EL layer to emit light and also detects a touch by the user according to a change in capacitance between the positive electrode pattern for detection use and the negative electrode pattern for detection use.

* * * * *